(12) United States Patent
Masui et al.

(10) Patent No.: US 7,884,386 B2
(45) Date of Patent: Feb. 8, 2011

(54) SEMICONDUCTOR LIGHT-EMITTING DEVICE

(75) Inventors: Yuji Masui, Kanagawa (JP); Rintaro Koda, Tokyo (JP); Osamu Maeda, Kanagawa (JP); Takahiro Arakida, Kanagawa (JP); Terukazu Naruse, Kanagawa (JP); Naoki Jogan, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 12/657,809

(22) Filed: Jan. 28, 2010

(65) Prior Publication Data

US 2010/0200868 A1 Aug. 12, 2010

(30) Foreign Application Priority Data

Feb. 6, 2009 (JP) ............................ P2009-026672

(51) Int. Cl.
*H01L 33/00* (2010.01)
(52) U.S. Cl. ............................. 257/98; 257/82; 257/90
(58) Field of Classification Search ................... 257/82, 257/90, 98
See application file for complete search history.

(56) References Cited

U.S. PATENT DOCUMENTS

| | | |
|---|---|---|
| 5,887,013 A | 3/1999 | Lee et al. |
| 6,692,979 B2 * | 2/2004 | Yeh et al. ...................... 438/27 |
| 7,709,358 B2 * | 5/2010 | Guenter et al. .............. 438/483 |
| 2007/0120133 A1 * | 5/2007 | Koda et al. ..................... 257/80 |

FOREIGN PATENT DOCUMENTS

| | | |
|---|---|---|
| JP | 2877785 A | 5/1998 |
| JP | 2007-150193 A | 6/2007 |

* cited by examiner

*Primary Examiner*—Wai-Sing Louie
*Assistant Examiner*—Bilkis Jahan
(74) *Attorney, Agent, or Firm*—Lerner, David, Littenberg, Krumholz & Mentlik, LLP (57) ABSTRACT

A semiconductor light-emitting device includes a semiconductor light-emitting element including a first multilayer reflector, an active layer having a light-emitting region, and a second multilayer reflector in the stated order; a semiconductor light-detecting element disposed opposite the first multilayer reflector in relation to the semiconductor light-emitting element and including a light-absorbing layer configured to absorb light emitted from the light-emitting region; a transparent substrate disposed between the semiconductor light-emitting element and the semiconductor light-detecting element; a first metal layer having a first opening in a region including a region opposite the light-emitting region and bonding the semiconductor light-emitting element and the substrate; and a second metal layer having a second opening in a region including a region opposite the light-emitting region and bonding the semiconductor light-detecting element and the substrate.

5 Claims, 6 Drawing Sheets

SEMICONDUCTOR LIGHT-EMITTING DEVICE

CROSS-REFERENCE TO RELATED APPLICATION

The present application claims priority from Japanese Patent Application No. JP 2009-026672 filed in the Japanese Patent Office on Feb. 6, 2009, the entire content of which is incorporated herein by reference.

BACKGROUND OF THE INVENTION

1. Field of the Invention

The present invention relates to semiconductor light-emitting devices including semiconductor light-detecting elements for detecting emitted light, and particularly to a semiconductor light-emitting device suitable for high-optical-detection-accuracy applications.

2. Description of the Related Art

A semiconductor light-emitting device used in the related art for applications such as optical fibers and optical disks has a light-detecting mechanism for detecting light emitted from a semiconductor light-emitting element built into the light-emitting device to keep the optical output level thereof constant. The light-detecting mechanism includes, for example, a reflector configured to split off a portion of the emitted light and a semiconductor light-detecting element configured to detect the split light. This mechanism, however, has a problem in that the number of components is increased and that the reflector and the semiconductor light-detecting element are to be accurately positioned relative to the semiconductor light-emitting element. One possible solution to that problem is to integrally form the semiconductor light-emitting element and the semiconductor light-detecting element.

However, if the two elements are integrally formed, the semiconductor light-detecting element can detect not only stimulated emission light, which is to be detected, but also spontaneous emission light. In this case, the optical output level of the semiconductor light-emitting element measured on the basis of the light detected by the semiconductor light-detecting element would contain the error corresponding to the spontaneous emission light. Thus, this method is unsuitable for applications where the optical output level is to be accurately controlled.

Japanese Patent No. 2877785 proposes a technique of providing a control layer in the semiconductor light-detecting element to block a portion of spontaneous emission light input from the semiconductor light-emitting element before the light is detected by the semiconductor light-detecting element.

BRIEF SUMMARY OF THE INVENTION

The above control layer is formed by partially oxidizing the semiconductor material forming the semiconductor light-detecting element. The oxidized semiconductor, however, incompletely blocks the spontaneous emission light, most of which passes through the oxidized semiconductor.

Accordingly, it is desirable to provide a semiconductor light-emitting device having improved optical detection accuracy with a reduced level of spontaneous emission light detected by a semiconductor light-detecting element.

A semiconductor light-emitting device according to an embodiment of the present invention includes a semiconductor light-emitting element including a first multilayer reflector, an active layer having a light-emitting region, and a second multilayer reflector in the stated order; a semiconductor light-detecting element disposed opposite the first multilayer reflector in relation to the semiconductor light-emitting element and including a light-absorbing layer configured to absorb light emitted from the light-emitting region; a transparent substrate disposed between the semiconductor light-emitting element and the semiconductor light-detecting element; a first metal layer having a first opening in a region including a region opposite the light-emitting region and bonding the semiconductor light-emitting element and the transparent substrate; and a second metal layer having a second opening in a region including a region opposite the light-emitting region and bonding the semiconductor light-detecting element and the transparent substrate.

In the above semiconductor light-emitting device, the transparent substrate is inserted between the semiconductor light-emitting element and the semiconductor light-detecting element so that the light-emitting region and the light-absorbing layer are separated by a large distance. Thus, most spontaneous emission light in the light emitted from the light-emitting region travels in such directions as not to reach the light-absorbing layer and is reflected by the first and second metal layers.

In the above semiconductor light-emitting device, because the transparent substrate is inserted between the semiconductor light-emitting element and the semiconductor light-detecting element so that the light-emitting region and the light-absorbing layer are separated by a large distance, most spontaneous emission light in the light emitted from the light-emitting region travels in such directions as not to reach the light-absorbing layer and is reflected by the first and second metal layers. As a result, the level of spontaneous emission light detected by the semiconductor light-detecting element can be reduced to improve the optical detection accuracy.

DESCRIPTION OF THE PREFERRED EMBODIMENTS

Figure 1:
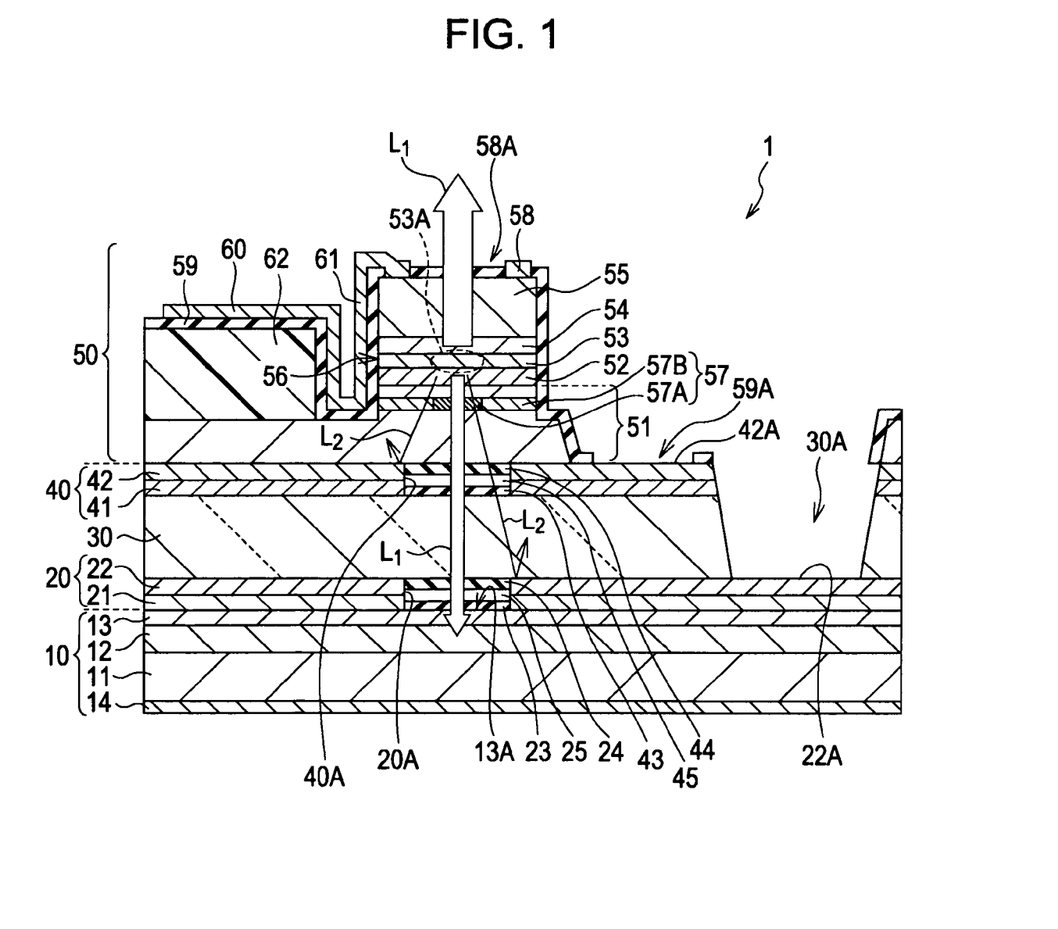
FIG. 1 is a sectional view of a semiconductor laser according to an embodiment of the present invention.

An embodiment of the present invention will now be described in detail with reference to the drawings. The description will be given in the following order:
1. Structure
2. Production method
3. Operation and advantages
4. Variations Structure FIG. 1 shows an example of the sectional structure of a semiconductor laser 1 according to an embodiment of the present invention. The components of the semiconductor laser 1 are schematically illustrated in FIG. 1 and differ in size and shape from actual ones. This semiconductor laser 1 is formed by stacking a metal layer 20, a transparent substrate 30, a metal layer 40, and a semiconductor laser element 50 on a semiconductor light-detecting element 10 in the stated order. The semiconductor laser 1 corresponds to a specific example of a semiconductor light-emitting device, and the semiconductor laser element 50 corresponds to a specific example of a semiconductor light-emitting element. In addition, the metal layer 20 corresponds to a specific example of a second metal layer, and the metal layer 40 corresponds to a specific example of a first metal layer.

The semiconductor light-detecting element 10 and the transparent substrate 30 are bonded together with the metal layer 20 therebetween, and the semiconductor laser element 50 and the transparent substrate 30 are bonded together with the metal layer 40 therebetween. That is, the semiconductor laser integrally includes the semiconductor light-detecting element 10, the metal layer 20, the transparent substrate 30, the metal layer 40, and the semiconductor laser element 50. The semiconductor laser element 50 will be described first, and the other elements will be sequentially described thereafter.

Semiconductor Laser Element 50

The semiconductor laser element 50 is a top-emitting laser formed by stacking, for example, a p-type distributed Bragg reflector (DBR) layer 51, a p-type cladding layer 52, an active layer 53, an n-type cladding layer 54, and an n-type DBR layer 55 on the metal layer 40 in the stated order. The top of the p-type DBR layer 51, the p-type cladding layer 52, the active layer 53, the n-type cladding layer 54, and the n-type DBR layer 55 constitute a columnar (cylindrical) mesa portion 56 having a diameter of, for example, about 30 μm. The p-type DBR layer 51 corresponds to a first multilayer reflector, and the n-type DBR layer 55 corresponds to a second multilayer reflector.

The p-type DBR layer 51 is formed by alternately stacking low-refractive-index layers (not shown) and high-refractive-index layers (not shown). The low-refractive-index layers are formed of, for example, p-type $Al_{x1}Ga_{1-x1}As$ films (where $0<x1<1$) having a thickness of $\lambda0/4n1$ (where $\lambda0$ is the oscillation wavelength and n1 is the refractive index). The high-refractive-index layers are formed of, for example, p-type $Al_{x2}Ga_{1-x2}As$ films (where $0<x2<x1$) having a thickness of $\lambda0/4n2$ (where n2 is the refractive index). Examples of the p-type impurity used include zinc (Zn), magnesium (Mg), and beryllium (Be).

The p-type cladding layer 52 is formed of, for example, p-type $Al_{x3}Ga_{1-x3}As$ (where $0<x3<1$). The active layer 53 is formed of, for example, undoped $Al_{x4}Ga_{1-x4}As$ (where $0<x4<1$). The active layer 53 has a light-emitting region 53A opposite a current-injecting region 57A, described later. The n-type cladding layer 54 is formed of, for example, n-type $Al_{x5}Ga_{1-x5}As$ (where $0\leq x5<1$). Examples of the n-type impurity used include silicon (Si) and selenium (Se).

The n-type DBR layer 55 is formed by alternately stacking low-refractive-index layers (not shown) and high-refractive-index layers (not shown). The low-refractive-index layers are formed of, for example, n-type $Al_{x6}Ga_{1-x6}As$ (where $0<x6<1$) having a thickness of $\lambda0/4n3$ (where n3 is the refractive index). The high-refractive-index layers are formed of, for example, n-type $Al_{x7}Ga_{1-x7}As$ films (where $0<x7<x6$) having a thickness of $\lambda0/4n4$ (where n4 is the refractive index).

The semiconductor laser element 50 also includes a current-narrowing layer 57, for example, in the p-type DBR layer 51. The current-narrowing layer 57 is provided at the position corresponding to, for example, the low-refractive-index layer that is several layers apart from the active layer side in the p-type DBR layer 51 instead of that low-refractive-index layer. The current-narrowing layer 57 has a current-narrowing region 57B in the peripheral region thereof, with the central region forming the current-injecting region 57A. The current-injecting region 57A is formed of, for example, n-type $Al_{x8}Ga_{1-x8}As$ (where $0<x8\leq 1$). The current-narrowing region 57B contains, for example, aluminum oxide ($Al2O3$) and, as described later, is formed by oxidizing an unoxidized layer 57D containing a high concentration of aluminum from the side surface thereof. Thus, the current-narrowing layer 57 functions to narrow a current. The current-narrowing layer 57 may instead be formed, for example, inside the n-type DBR layer 55, between the p-type cladding layer 52 and the p-type DBR layer 51, or between the n-type cladding layer 54 and the n-type DBR layer 55.

An upper electrode 58 is formed on the top surface of the mesa portion 56. The upper electrode 58 has, for example, an annular shape with an opening (aperture 58A) defined in a region including the region opposite the current-injecting region 57A. The upper electrode 58 may have another shape that does not block the region opposite the current-injecting region 57A. In addition, an insulating layer 59 is formed on the top surface (around the aperture 58A) and side surface of the mesa portion 56 and in the periphery thereof. An electrode pad 60 to which a wire (not shown) is to be bonded and a connection portion 61 are provided on the surface of the insulating layer 59. The electrode pad 60 is electrically connected to the upper electrode 58 via the connection portion 61. In addition, a base 62 is provided under the electrode pad 60 to reduce parasitic capacitance. The base 62 is disposed between the insulating layer 59 and the p-type DBR layer 51 in a region where the mesa portion 46 is not formed.

The insulating layer 59 is formed of an insulating material such as an oxide or a nitride. The upper electrode 58, the electrode pad 60, and the connection portion 61 are formed by, for example, stacking a gold-germanium (Au—Ge) alloy film, a nickel (Ni) film, and a gold (Au) film in the stated order and are electrically connected to the top of the mesa portion 56 (n-type DBR layer 55). The base 62 is formed of, for example, polyimide.

Semiconductor Light-Detecting Element 10

Of the light emitted from the light-emitting region 53A of the semiconductor laser element 50, the semiconductor light-detecting element 10 detects a component incident on the semiconductor light-detecting element 10. The semiconductor light-detecting element 10 is formed by, for example, stacking a light-absorbing layer 12 and a p-type contact layer 13 on an n-type substrate 11 in the stated order. The semiconductor light-detecting element 10 also has a lower electrode 14 on the backside of the n-type substrate 11.

The n-type substrate 11 is formed of, for example, n-type GaAs. The light-absorbing layer 12 is formed of, for example, n-type Alx9Ga1−x9As (where 0<x9≦1). The light-absorbing layer 12 absorbs a portion of the light emitted from the light-emitting region 53A and converts the absorbed light into an electrical signal. This electrical signal is input to an optical-output arithmetic circuit (not shown) connected to the metal layer 20 and the lower electrode 14 as an optical-output monitoring signal used in the optical-output arithmetic circuit to measure the output level of laser light L1 emitted from the aperture 58A. The p-type contact layer 13 is formed of, for example, p-type Alx10Ga1−x10As (where 0≦x10≦1) and is electrically connected to the light-absorbing layer 12 and the metal layer 20.

Transparent Substrate 30

The transparent substrate 30 is a substrate transparent to light with the oscillation wavelength λ0 of the semiconductor laser element 50, and the electrical conductivity of the transparent substrate 30 depends on the method for driving the semiconductor laser 1. For example, if the semiconductor laser 1 is driven by applying voltages in phase to the metal layers 20 and 40, the transparent substrate 30 may be either insulating or conducting. On the other hand, for example, if the semiconductor laser 1 is differentially driven, the transparent substrate 30 is insulating. The insulating substrate used may be, for example, a GaP substrate or a sapphire substrate if the oscillation wavelength λ0 falls within the 850 nm range and may be, for example, a GaAs substrate if the oscillation wavelength λ0 falls within the 980 nm range. The term "differential driving" herein refers to, for example, application of voltages to the metal layers 20 and 40 such that the voltages are 180° out of phase with each other.

Metal Layer 20

The metal layer 20 is provided to bond the semiconductor light-detecting element 10 to the transparent substrate 30 and also functions as the upper electrode of the semiconductor light-detecting element 10. The metal layer 20 has a multilayer structure including a metal layer 21 and a metal layer 22 in order from the semiconductor light-detecting element 10 side. The metal layer 21 is formed by, for example, stacking a titanium (Ti) film, a platinum (Pt) film, and a gold (Au) film in order from the semiconductor light-detecting element 10 side and is electrically connected to the p-type contact layer 13 and the metal layer 22. The metal layer 22 is formed by, for example, stacking a titanium (Ti) film, a platinum (Pt) film, and a gold (Au) film in order from the transparent substrate 30 side and is electrically connected to the metal layer 21.

The metal layer 20 (metal layers 21 and 22) has an opening 20A (first opening) in a region including the region opposite the light-emitting region 53A. The opening 20A is a passage through which a portion of the light emitted from the light-emitting region 53A travels toward the semiconductor light-detecting element 10, and is formed, for example, in the region opposite the aperture 58A. The portion of the metal layer 20 other than the opening 20A functions as a reflective layer for reflecting spontaneous emission light contained in the light emitted from the light-emitting region 53A. A low-refractive-index layer 24 is provided in the opening 20A, specifically, on the portion of the transparent substrate 30 exposed in the top of the opening 20A, and a low-refractive-index layer 23 is provided on the portion of the p-type contact layer 13 exposed in the bottom of the opening 20A. In addition, a void 25 is present in the opening 20A between the low-refractive-index layers 23 and 24.

The low-refractive-index layers 23 and 24 are formed of, for example, a low-refractive-index material. The term "low-refractive-index material" herein refers to, for example, a material whose refractive index is higher than 1 (air) and is lower than that of the transparent substrate 30 or the p-type contact layer 13, for example, a transparent material such as SiN (refractive index=2.0). The low-refractive-index layers 23 and 24 preferably have an optical thickness of (2m−1)× λ0/4 (where m is a positive number). In this case, of the light with the wavelength λ0 incident from the light-emitting region 53A, light reflected at the interface between the low-refractive-index layer 23 and the p-type contact layer 13 is 180° out of phase with light reflected at the interface between the void 25 and the low-refractive-index layer 23. In addition, of the light with the wavelength 20 incident from the light-emitting region 53A, light reflected at the interface between the void 25 and the low-refractive-index layer 24 is 180° out of phase with light reflected at the interface between the low-refractive-index layer 24 and the transparent substrate 30. As a result, the reflectances at the low-refractive-index layers 23 and 24 become substantially zero. That is, in this case, the low-refractive-index layers 23 and 24 function as nonreflective layers.

In the metal layer 20, the top surface of the metal layer 22 is partially exposed, for example, in an opening 30A provided in the transparent substrate 30. This exposed surface 22A functions as the upper electrode of the semiconductor light-detecting element 10.

Metal Layer 40

The metal layer 40 is provided to bond the semiconductor laser element 50 to the transparent substrate 30 and also functions as the lower electrode of the semiconductor laser element 50. The metal layer 40 has a multilayer structure including a metal layer 41 and a metal layer 42 in order from the transparent substrate 30 side. The metal layer 41 is formed by, for example, stacking a titanium (Ti) film, a platinum (Pt) film, and a gold (Au) film in order from the transparent substrate 30 side and is electrically connected to the metal layer 42. The metal layer 42 is formed by, for example, stacking a titanium (Ti) film, a platinum (Pt) film, and a gold (Au) film in order from the p-type DBR layer 51 side and is electrically connected to the p-type DBR layer 51 and the metal layer 41.

The metal layer 40 (metal layers 41 and 42) has an opening 40A (second opening) in a region including the region opposite the light-emitting region 53A. The opening 40A is a passage through which a portion of the light emitted from the light-emitting region 53A travels toward the semiconductor light-detecting element 10, and is formed, for example, in the region opposite the aperture 58A. The portion of the metal layer 40 other than the opening 40A functions as a reflective layer for reflecting spontaneous emission light contained in the light emitted from the light-emitting region 53A. A low-refractive-index layer 43 is provided in the opening 40A, specifically, on the portion of the transparent substrate 30 exposed in the bottom of the opening 40A, and a low-refractive-index layer 44 is provided on the portion of the p-type DBR layer 51 exposed in the top of the opening 40A. In addition, a void 45 is present in the opening 40A between the low-refractive-index layers 43 and 44.

The low-refractive-index layers 43 and 44 are formed of, for example, a low-refractive-index material, as are the low-refractive-index layers 23 and 24. The term "low-refractive-index material" herein refers to, for example, a material whose refractive index is higher than 1 (air) and is lower than that of the transparent substrate 30 or the p-type DBR layer 51, for example, a transparent material such as SiN (refractive index=2.0). The low-refractive-index layers 43 and 44 preferably have an optical thickness of $(2n-1)\times\lambda_0/4$ (where n is a positive number). In this case, of the light with the wavelength $\lambda_0$ incident from the light-emitting region 53A, light reflected at the interface between the low-refractive-index layer 43 and the transparent substrate 30 is 180° out of phase with light reflected at the interface between the void 45 and the low-refractive-index layer 43. In addition, of the light with the wavelength $\lambda_0$ incident from the light-emitting region 53A, light reflected at the interface between the void 45 and the low-refractive-index layer 44 is 180° out of phase with light reflected at the interface between the low-refractive-index layer 44 and the p-type DBR layer 51. As a result, the reflectances at the low-refractive-index layers 43 and 44 become substantially zero. That is, in this case, the low-refractive-index layers 43 and 44 function as nonreflective layers.

In the metal layer 40, the top surface of the metal layer 42 is partially exposed, for example, in an opening 59A provided in the insulating layer 59. This exposed surface 42A functions as the lower electrode of the semiconductor laser element 50.

Production Method

The semiconductor laser 1 according to this embodiment can be produced, for example, as follows. FIGS. 2 to 10 show a process of producing the semiconductor laser 1 in the order in which the process proceeds. FIGS. 2 to 10 show the sectional structures of the individual elements during the production process.

The individual semiconductor layers are formed by, for example, metal-organic chemical vapor deposition (MOCVD).

The source materials used for the III-V compound semiconductors are, for example, trimethylaluminum (TMA), trimethylgallium (TMG), trimethylindium (TMIn), and arsine (AsH3). The source material used for the donor impurity is, for example, H2Se, and the source material used for the acceptor impurity is, for example, dimethylzinc (DMZ).

Figure 2:
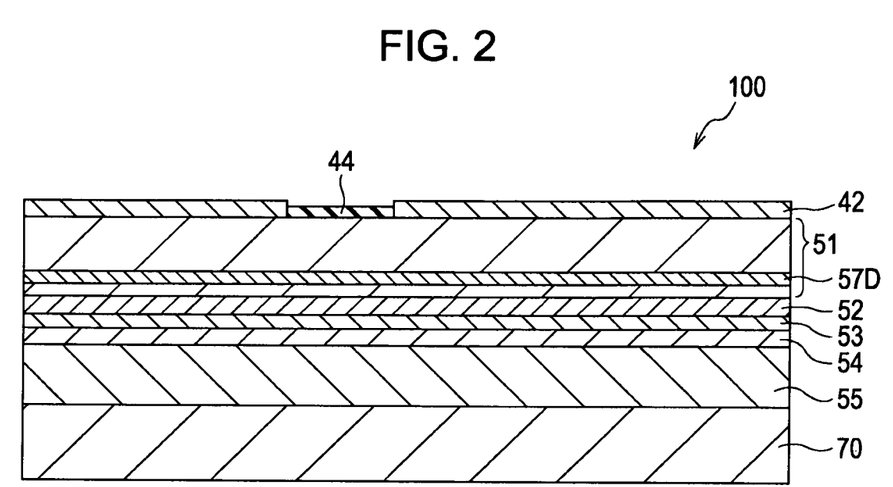
FIG. 2 is a sectional view illustrating a step of a process of producing the semiconductor laser in FIG. 1.

Specifically, first, the n-type DBR layer 55, the n-type cladding layer 54, the active layer 53, the p-type cladding layer 52, and the p-type DBR layer 51 are formed on a substrate 70 of, for example, n-type GaAs in the stated order (FIG. 2). In this step, the unoxidized layer 57D is formed, for example, as part of the p-type DBR layer 51. The unoxidized layer 57D is a layer that is to be oxidized in an oxidation step, described later, to form the current-narrowing layer 57 and that contains, for example, AlAs. The metal layer 42 is then formed on the p-type DBR layer 51 so as to have an opening, and the low-refractive-index layer 44 is formed in the opening (FIG. 2). Thus, a first substrate 100 is formed.

Figure 3:
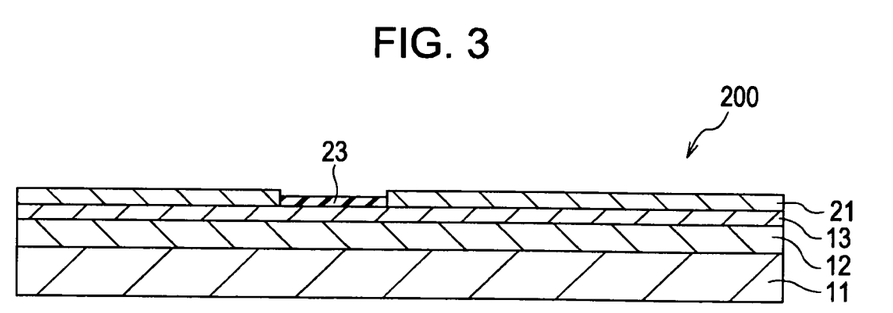
FIG. 3 is a sectional view illustrating a step following the step in FIG. 2.

On the other hand, the light-absorbing layer 12 and the p-type contact layer 13 are formed on the substrate 11 in the stated order (FIG. 3). The metal layer 21 is then formed on the p-type contact layer 13 so as to have an opening, and the low-refractive-index layer 23 is formed in the opening (FIG. 3). Thus, a second substrate 200 is formed.

Figure 4:
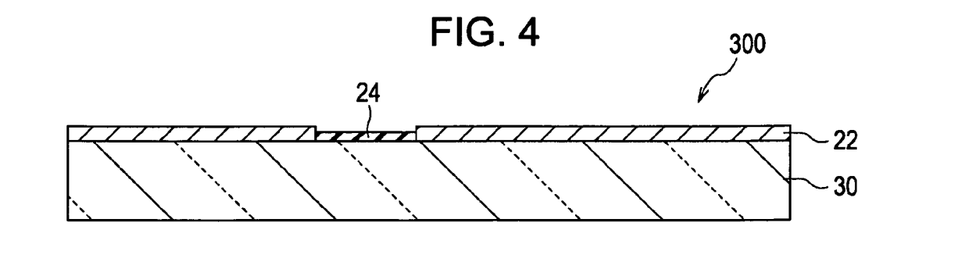
FIG. 4 is a sectional view illustrating a step following the step in FIG. 3.

In addition, the metal layer 22 is formed on the transparent substrate 30 so as to have an opening, and the low-refractive-index layer 24 is formed in the opening (FIG. 4). Thus, a third substrate 300 is formed.

Figure 5:
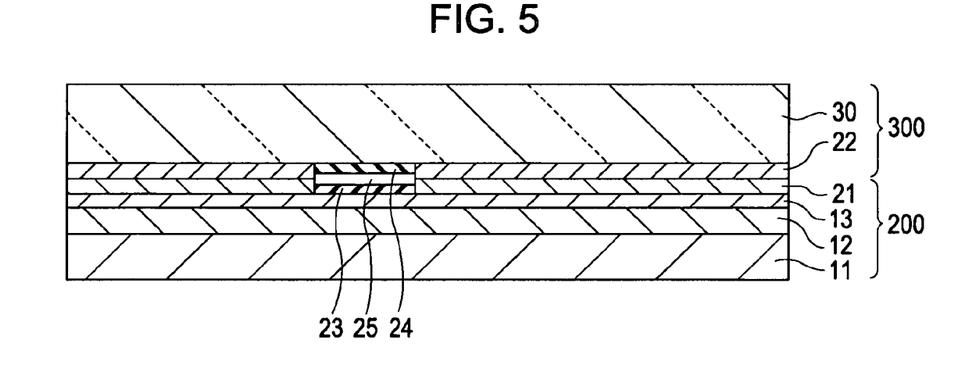
FIG. 5 is a sectional view illustrating a step following the step in FIG. 4.
Figure 6:
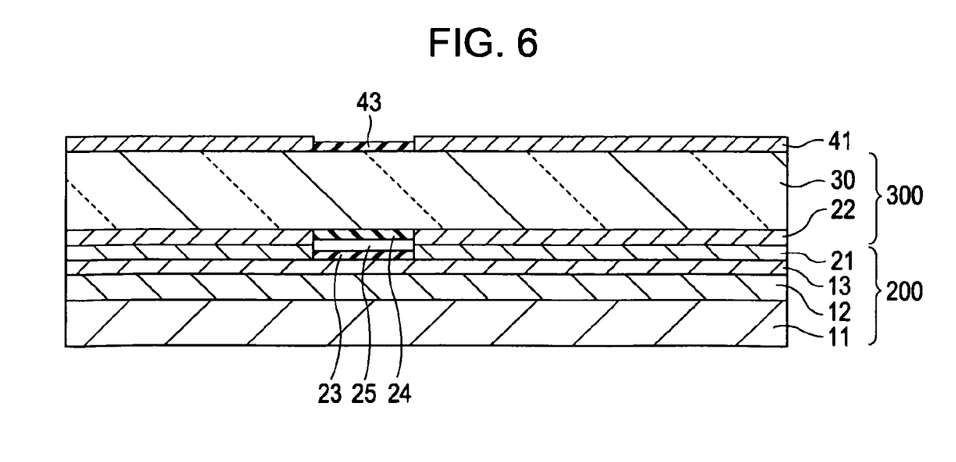
FIG. 6 is a sectional view illustrating a step following the step in FIG. 5.

Next, the third substrate 300 is bonded to the metal layer 21 of the second substrate 200 with the metal layer 22 facing the metal layer 21 (FIG. 5). As a result, the metal layers 21 and 22 are bonded together, and the void 25 is formed between the low-refractive-index layers 23 and 24. The metal layer 41 is then formed on the surface of the third substrate 300 (on the surface of the transparent substrate 30) facing away from the second substrate 200 so as to have an opening, and the low-refractive-index layer 43 is formed in the opening (FIG. 6).

Figure 7:
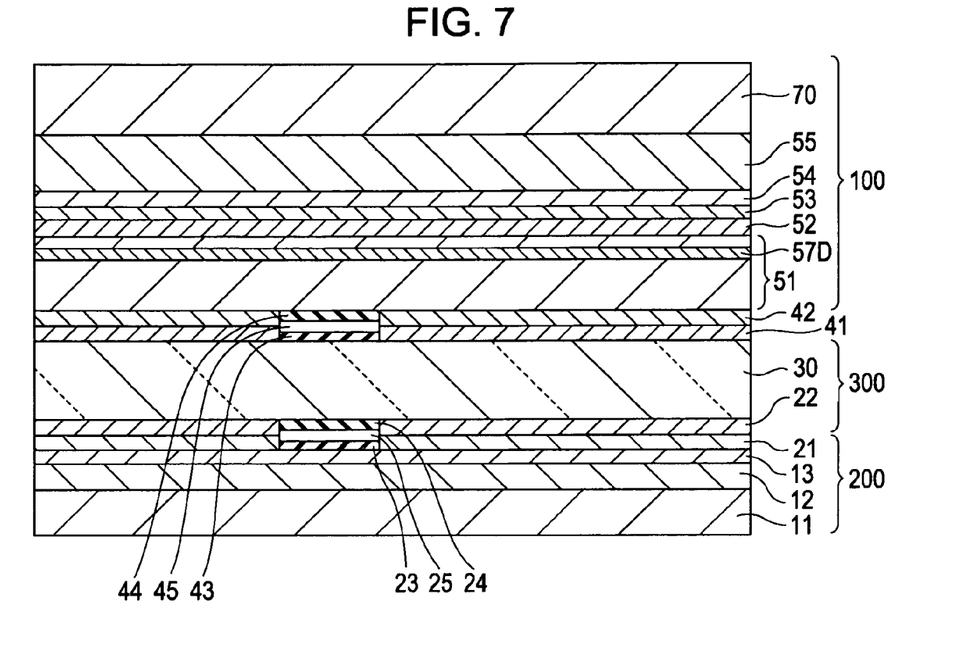
FIG. 7 is a sectional view illustrating a step following the step in FIG. 6.
Figure 8:
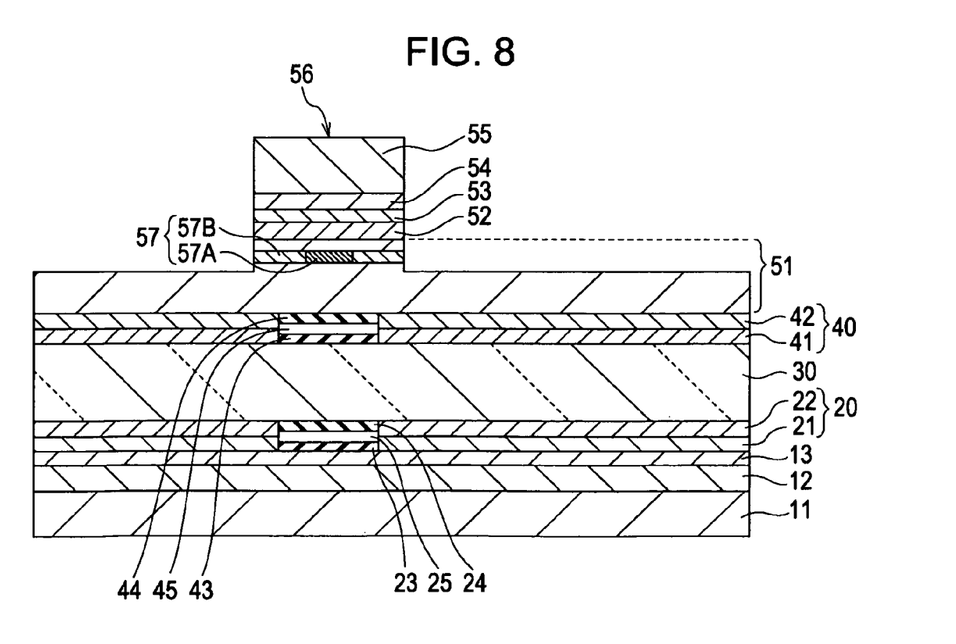
FIG. 8 is a sectional view illustrating a step following the step in FIG. 7.

Next, the first substrate 100 is bonded to the metal layer 41 with the metal layer 42 facing the metal layer 41 (FIG. 7). As a result, the metal layers 41 and 42 are bonded together, and the void 45 is formed between the low-refractive-index layers 43 and 44. The substrate 70 is then removed, and the n-type DBR layer 55, the n-type cladding layer 54, the active layer 53, the p-type cladding layer 52, the p-type DBR layer 51, and the unoxidized layer 57D are selectively removed to form the mesa portion 56 (FIG. 8).

Next, the unoxidized layer 57D is selectively oxidized from the side surface of the mesa portion 56 by oxidation treatment at high temperature in a water vapor atmosphere. As a result, the peripheral region of the unoxidized layer 57D becomes an insulating layer (aluminum oxide). Accordingly, the current-narrowing region 57B is formed in the peripheral region, with the central region serving as the current-injecting region 57A. Thus, the current-narrowing layer 57 is formed (FIG. 8).

Figure 9:
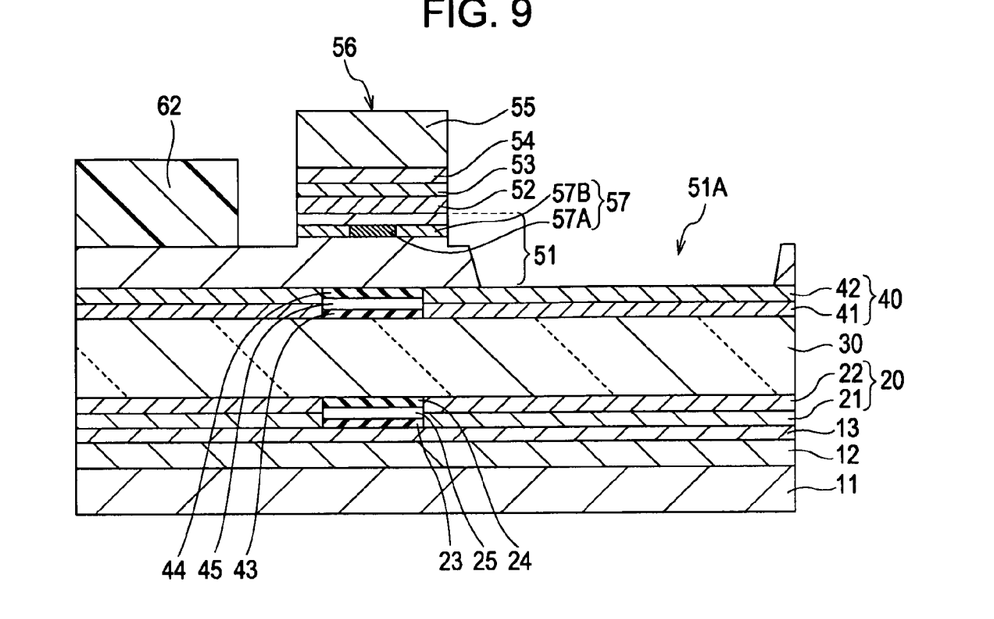
FIG. 9 is a sectional view illustrating a step following the step in FIG. 8.
Figure 10:
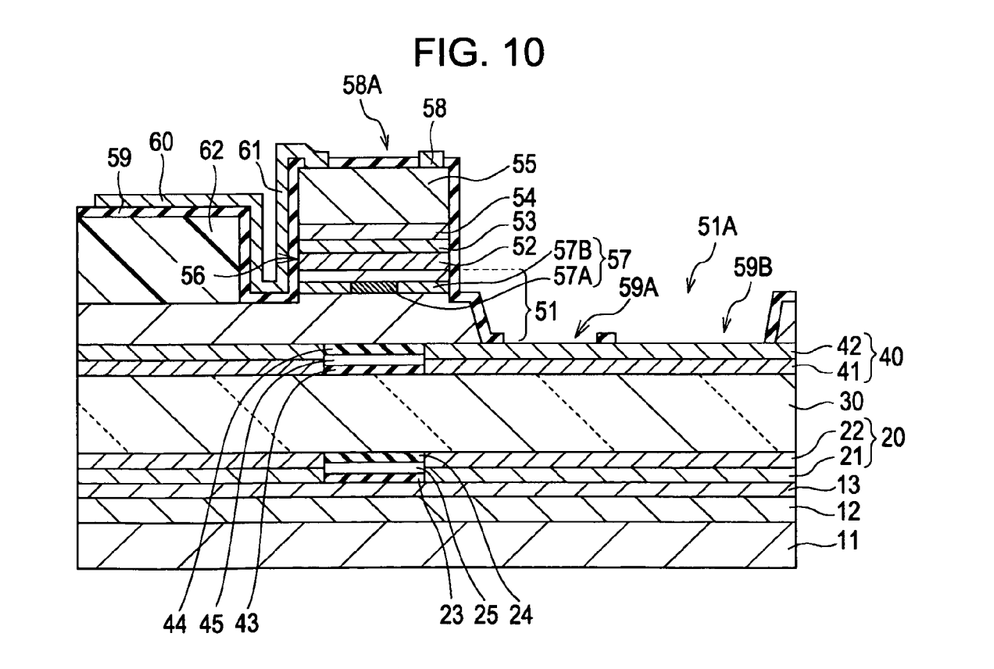
FIG. 10 is a sectional view illustrating a step following the step in FIG. 9.

Next, the base 62 is formed on the p-type DBR layer 51 in a region where the mesa portion 46 is not formed, and an opening 51A is formed (FIG. 9). The insulating layer 59 is then formed on the entire surface, and the upper electrode 58, the electrode pad 60, and the connection portion 61 are formed by, for example, evaporation (FIG. 10). In addition, the portion of the insulating layer 59 corresponding to the bottom of the opening 51 is selectively removed to form the opening 59A and an opening 59B.

Next, the portion of the metal layer 40 corresponding to the opening 59B is removed to expose the transparent substrate 30, and the exposed portion of the transparent substrate 30 is selectively removed to form the opening 30A (FIG. 1). In addition, the lower electrode 14 is formed on the backside of the substrate 10 (FIG. 1). Thus, the semiconductor laser 1 according to this embodiment is produced.

In the semiconductor laser 1 according to this embodiment, for example, if the transparent substrate 30 is conductive, the metal layers 20 and 40 can be used as a common electrode for the semiconductor laser element 50 and the semiconductor light-detecting element 10. With the common electrode as a ground, a current for driving the semiconductor laser element 50 is supplied from the upper electrode 58, and a reverse bias voltage is applied to the lower electrode 14. Even if the transparent substrate 30 is insulating, the metal layers 20 and 40 can each be used as a ground to perform driving as in the case where the metal layers 20 and 40 are used as a common electrode.

In the semiconductor laser 1 according to this embodiment, for example, if the transparent substrate 30 is insulating, the semiconductor laser element 50 and the semiconductor light-detecting element 10 can be independently driven because the metal layers 20 and 40 are electrically insulated. For example, a voltage is applied between the upper electrode 58 and the metal layer 40 in phase with each other so that the potential difference between the upper electrode 58 and the metal layer 40 remains constant. On the other hand, a voltage is applied between the lower electrode 14 and the metal layer 20 in phase with each other and 180° out of phase with the voltage applied between the upper electrode 58 and the metal layer 40 so that the potential difference between the lower electrode 14 and the metal layer 20 remains constant.

In each of the above cases, a current narrowed by the current-narrowing layer 57 is injected into the light-emitting region 53A, the gain region of the active layer 53, thus causing emission of light through recombination of electrons and holes. Although this light contains both stimulated emission light and spontaneous emission light, laser oscillation occurs at the wavelength λ0 (for example, 850 nm) as stimulated emission is repeated inside the element 50. As a result, the light L1 having the wavelength 20 is output from the aperture 58A to exit outside, and at the same time is slightly output from the p-type DBR layer 51 toward the semiconductor light-detecting element 10. A portion of the light passes through the transparent substrate 30 and the openings 20A and 40A to reach the light-absorbing layer 12 (FIG. 1).

The light incident on the light-absorbing layer 12 is absorbed by the light-absorbing layer 12 and is converted into an electrical signal (photocurrent) corresponding to the output level of the absorbed light. The electrical signal is output to an optical-output arithmetic circuit (not shown) via wires (not shown) electrically connected to the metal layer 20 and the lower electrode 14 and is received by the optical-output arithmetic circuit as an optical-output monitoring signal. Thus, the output level of the light incident on the light-absorbing layer 12 is measured.

As described above, if noise enters the semiconductor laser element 50 or the semiconductor light-detecting element when they are differentially driven, the noise can be cancelled. This allows the semiconductor laser element 50 to provide a stable optical output unaffected by noise and the semiconductor light-detecting element 10 to output an electrical signal unaffected by noise.

Operation and Advantages

Figure 11:
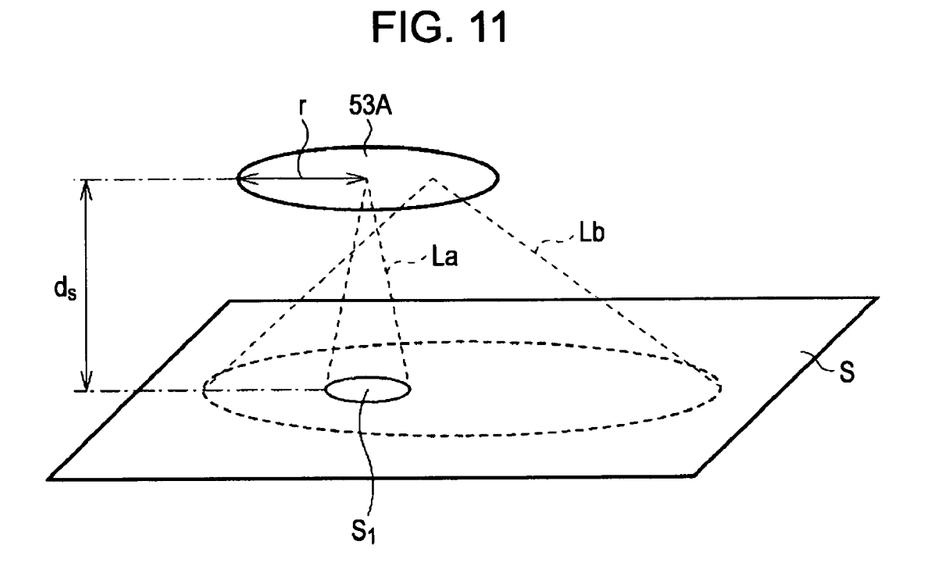
FIG. 11 is a schematic diagram showing the manner in which stimulated emission light and spontaneous emission light are emitted from a light-emitting region in FIG. 1.
Figure 12:
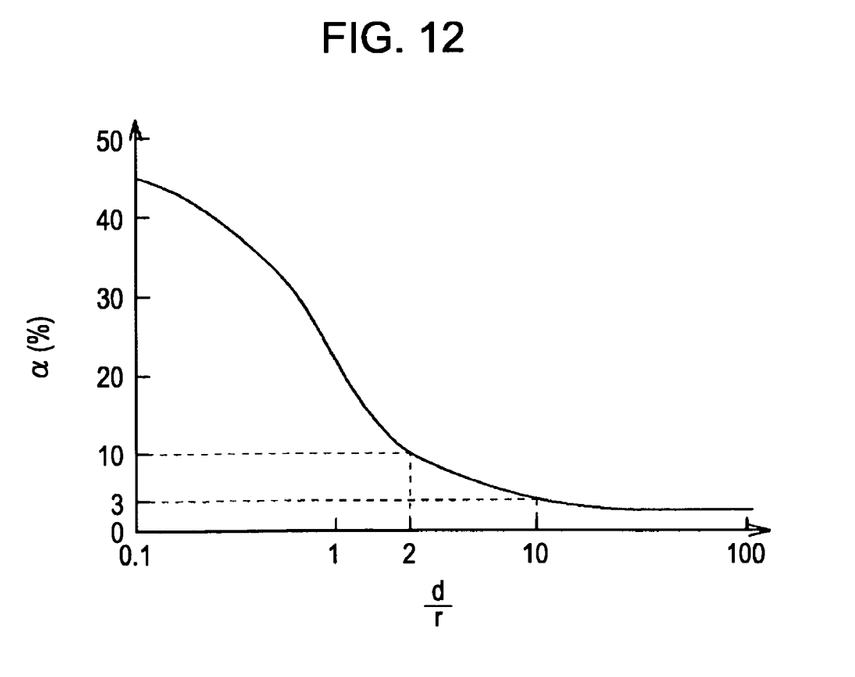
FIG. 12 is a graph showing the relationship between d/r (the ratio of the distance between the light-emitting region and a light-receiving region to the radius of the light-emitting region) and a (the proportion of spontaneous emission light in incident light).

Next, the relationship between the light-emitting region 53A and the portion of the p-type contact layer 13 exposed in the bottom of the opening 20A (light-receiving region 13A) will be described with reference to FIGS. 11 and 12. FIG. 11 schematically shows the manner in which stimulated emission light and spontaneous emission light are emitted from the light-emitting region 53A. FIG. 12 is a graph showing the relationship between d/r and a in the case where the angle of radiation of stimulated emission light is 30°, where d is the distance between the light-emitting region 53A and the light-receiving region 13A, r is the radius of the light-emitting region 53A, and α is the proportion of spontaneous emission light in light incident in a predetermined region. Specifically, α is represented by the following equation:

$$\alpha = A2/(A1+A2) \times 100$$

where A1 is the intensity of stimulated emission light emitted from the light-emitting region 53A and incident in the predetermined region, and A2 is the intensity of spontaneous emission light emitted from the light-emitting region 53A and incident in the predetermined region.

In general, the angle of radiation of stimulated emission light (laser light) in the light emitted from the light-emitting region 53A is typically about 30°, and the angle of radiation of spontaneous emission light in the light emitted from the light-emitting region 53A is much larger than that of stimulated emission light. Hence, an irradiation region S1 formed when a predetermined surface S is irradiated with stimulated emission light La emitted from one minute region of the light-emitting region 53A is reached by spontaneous emission light Lb emitted from another minute region remote from the above minute region. In particular, if the distance ds between the light-emitting region 53A and the predetermined surface S is similar to or smaller than the radius r of the light-emitting region 53A, most of the spontaneous emission light Lb reaches the irradiation region S1 (corresponding to the left of FIG. 12).

Accordingly, even if the light-receiving region 13A is formed in a region where all stimulated emission light emitted from the light-emitting region 53A is theoretically incident, the proportion a of spontaneous emission light is considerable if the light-receiving region 13A is close to the light-emitting region 53A. For example, for a surface-emitting laser used in the related art for 10 Gbps optical communication, the radius r of the light-emitting region 53A is about 5 μm, and the distance d between the light-emitting region 53A and the light-receiving region 13A is 10 μm or less. Hence, the proportion a of spontaneous emission light exceeds 10%.

In this embodiment, on the other hand, the transparent substrate 30 is inserted between the light-emitting region 53A and the exposed portion 13A. Thus, the thicker the transparent substrate 30, the larger the distance d between the light-emitting region 53A and the exposed portion 13A. For example, if the transparent substrate 30 has a thickness of 100 μm, the distance d is at least more than 100 μm, that is, at least ten to one hundred times the typical radius r of the light-emitting region 53A (for example, 1 to 10 μm). That is, if the distance d and the radius r satisfy $d/r \geq 10$, most of the spontaneous emission light L2 in the light emitted from the light-emitting region 53A travels in such directions as not to reach the light-absorbing layer 12 and is reflected by the metal layers 20 and 40. Thus, the proportion of spontaneous emission light in the light incident in the light-receiving region 13A can be sufficiently reduced. For example, if the angle of radiation of stimulated emission light is 30°, the proportion of spontaneous emission light can be reduced to 3% or less (see FIG. 12). As a result, the level of spontaneous emission light detected by the semiconductor light-detecting element 10 can be reduced to improve the optical detection accuracy.

Variations

While the present invention has been described above with reference to the embodiment, the present invention is not limited to the above embodiment, and various modifications are permitted.

For example, although the semiconductor materials used in the above embodiment are GaAs-based compound semiconductors, other material systems such as GaInP-based (red) materials, AlGaAs-based (infrared) materials, and GaN-based (blue-green) materials can also be used.

Although the conductivity types of semiconductors are exemplified in the above embodiment, the conductivity types opposite to the exemplary conductivity types can also be used. For example, it is possible to replace "p-type" with "n-type" and to replace "n-type" with "p-type" in the above embodiment.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor light-emitting device comprising:
   a semiconductor light-emitting element including a first multilayer reflector, an active layer having a light-emitting region, and a second multilayer reflector in the stated order;
   a semiconductor light-detecting element disposed opposite the first multilayer reflector in relation to the semiconductor light-emitting element and including a light-absorbing layer configured to absorb light emitted from the light-emitting region;
   a transparent substrate disposed between the semiconductor light-emitting element and the semiconductor light-detecting element;

a first metal layer having a first opening in a region including a region opposite the light-emitting region and bonding the semiconductor light-emitting element and the substrate; and a second metal layer having a second opening in a region including a region opposite the light-emitting region and bonding the semiconductor light-detecting element and the substrate.

2. The semiconductor light-emitting device according to claim 1, wherein the following relationship is satisfied:

$$d/r \geq 10$$

wherein d is the distance between the light-emitting region and the semiconductor light-detecting element and r is the radius of the light-emitting region.

3. The semiconductor light-emitting device according to claim 1, wherein the semiconductor light-emitting element includes an annular electrode disposed on the second multilayer reflector, the annular electrode having an aperture in a region including a region opposite the light-emitting region; and the first and second openings are provided in a region opposite the aperture.

4. The semiconductor light-emitting device according to claim 1, wherein the substrate is conductive.

5. The semiconductor light-emitting device according to claim 1, wherein the substrate is insulating.

* * * * *